(12) United States Patent
Zhao et al.

(10) Patent No.: US 11,448,392 B2
(45) Date of Patent: Sep. 20, 2022

(54) BLADE ASSEMBLY AND FAN DISPLAY HAVING THE SAME

(71) Applicant: FOSHAN NATIONSTAR OPTOELECTRONICS CO., LTD., Foshan (CN)

(72) Inventors: Qiang Zhao, Foshan (CN); Kuai Qin, Foshan (CN); Heng Guo, Foshan (CN); Changqi Wang, Foshan (CN); Zongxian Xie, Foshan (CN); Kailiang Fan, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 149 days.

(21) Appl. No.: 16/883,163

(22) Filed: May 26, 2020

(65) Prior Publication Data

US 2020/0378595 A1    Dec. 3, 2020

(30) Foreign Application Priority Data

May 28, 2019   (CN) .......................... 201910453067.3

(51) Int. Cl.
| | |
|---|---|
| *F21V 33/00* | (2006.01) |
| *F21V 19/00* | (2006.01) |
| *H01L 25/065* | (2006.01) |
| *H01L 23/02* | (2006.01) |
| *H01L 23/28* | (2006.01) |
| *H01L 33/48* | (2010.01) |

(Continued)

(52) U.S. Cl.
CPC ........ *F21V 33/0096* (2013.01); *F21V 19/002* (2013.01); *H01L 23/02* (2013.01);
(Continued)

(58) Field of Classification Search
CPC .... F21V 33/0096; F21V 19/002; H01L 23/02; H01L 23/28; H01L 25/0655;
(Continued)

(56) References Cited

U.S. PATENT DOCUMENTS

| | | | |
|---|---|---|---|
| 10,422,317 B2 * | 9/2019 | Agtuca | ................. F03D 1/0675 |
| 10,734,355 B2 * | 8/2020 | Suyama | .............. H01L 23/3121 |

(Continued)

FOREIGN PATENT DOCUMENTS

| | | |
|---|---|---|
| CN | 208027715 U | 10/2018 |
| CN | 108986725 A | 12/2018 |

(Continued)

OTHER PUBLICATIONS

Translation of China's First Action (Year: 2020).*
Translated Chinese Office Action, pp. 1-11.

*Primary Examiner* — Tracie Y Green
(74) *Attorney, Agent, or Firm* — George McGuire

(57) ABSTRACT

A blade assembly and a fan display including the same. The blade assembly includes a circuit substrate provided in an elongated shape, a lamination board provided in an elongated shape and bonded to the circuit substrate by a laminating glue, and a plurality of light emitting diode (LED) light emitting units. A mounting hole is defined in the lamination board and passes through a thickness of the lamination board. The circuit substrate has a first side attached to the lamination board, the first side and the mounting hole jointly defining a mounting cavity, in which plurality of LED light emitting units are hermetically disposed in the mounting cavity, and are arranged at intervals along a length of the circuit substrate.

18 Claims, 13 Drawing Sheets

(51) Int. Cl.
*H01L 33/52* (2010.01)
*F21Y 105/12* (2016.01)
*F21Y 113/13* (2016.01)
*F21Y 115/10* (2016.01)

(52) U.S. Cl.
CPC .......... *H01L 23/28* (2013.01); *H01L 25/0655* (2013.01); *H01L 33/483* (2013.01); *H01L 33/52* (2013.01); *F21Y 2105/12* (2016.08); *F21Y 2113/13* (2016.08); *F21Y 2115/10* (2016.08)

(58) Field of Classification Search
CPC ... H01L 33/483; H01L 33/52; H01L 25/0753; F21Y 2105/12; F21Y 2113/13; F21Y 2115/10; F05D 2270/804; F04D 29/005; F04D 29/30; G09F 13/165; G09F 19/02; G09F 19/12; G09F 2013/222; G09F 9/302; G09F 9/33; G09F 9/37
See application file for complete search history.

(56) References Cited

U.S. PATENT DOCUMENTS

| | | | | |
|---|---|---|---|---|
| 11,138,915 B2 * | 10/2021 | Rohena | ................ | F04D 29/005 |
| 11,159,783 B2 * | 10/2021 | Kaehler | ................ | H04N 13/32 |
| 2005/0050778 A1 | 3/2005 | Kim et al. | | |
| 2007/0247832 A1 * | 10/2007 | Barker | ................ | F04D 29/38 |
| | | | | 362/96 |
| 2008/0243125 A1 * | 10/2008 | Guzman | ............. | A61B 17/142 |
| | | | | 606/82 |

FOREIGN PATENT DOCUMENTS

| | | | |
|---|---|---|---|
| CN | 208240677 U | * | 12/2018 |
| CN | 208240677 U | | 12/2018 |
| CN | 109147628 A | | 1/2019 |
| CN | 208368110 U | * | 1/2019 |
| CN | 208368110 U | | 1/2019 |
| CN | 112767855 A | * | 5/2021 |

* cited by examiner

BLADE ASSEMBLY AND FAN DISPLAY HAVING THE SAME

CROSS-REFERENCE TO RELATED APPLICATIONS

This application claims priority to Chinese patent application No. 201910453067.3 filed on May 28, 2019 with China National Intellectual Property Administration, disclosure of which is hereby incorporated herein by reference in its entirety.

TECHNICAL FIELD

The present disclosure relates to the technical field of display devices and, and more particularly, to a blade assembly and a fan display having the same.

BACKGROUND

As is well known, human's three-dimensional stereo vision of an object is caused by binocular parallax. All optical devices or structures that can cause binocular parallax to human eyes can produce three-dimensional stereo vision. A fan display uses a motor to drive light emitting diode (LED) light bars into rotation, and uses the visual persistence effect of human eyes and control of a software system to present a two-dimensional (2D) or three-dimensional (3D) stereoscopic effect.

Currently, there is a small number of LED lamps on each blade of the fan display, the fan display has certain transparency during rotation, and the cost is low, so the application of the fan display is more and more extensive. However, most of the LED lamps of an existing fan display are mounted onto a blade surface of the fan display by using surface mounted devices (SMDs), such design has the following problems.

1. The SMD has a relatively large size and thickness, when the SMD protrudes from the blade surface, the blade is subject to relatively large wind resistance in rotation, thus generating a big noise. 2. The SMD has a relatively large size leading to a low density of the SMDs on the blade, hence a low overall display resolution of the fan display. 3. Pins of the SMD are exposed, hence poor moisture-proof and waterproof performance. The SMD is not suitable for outdoor or semi-outdoor use. After long-term use, dust accumulates on surfaces and pins of the devices, which is not convenient for maintenance. 4. Exposed SMD are susceptible to bump and damage during assembly of the fan display.

SUMMARY

Embodiments of the present disclosure provide a blade assembly and a fan display having the same to solve the above-mentioned problem.

In a first aspect, the present disclosure provides a blade assembly including a circuit substrate, a lamination board, and a plurality of light emitting diode (LED) light emitting units. Both the circuit substrate and the lamination board are in an elongated shape, the circuit substrate and the lamination board are bonded to each other by a laminating glue. A mounting hole is defined in the lamination board, and passes through a thickness direction of the lamination board. The circuit substrate has a first side attached to the lamination board, the first side and the mounting hole jointly defining a mounting cavity. The plurality of the LED light emitting units are hermetically disposed in the mounting cavity, and are disposed at intervals along a length of the circuit substrate.

The circuit substrate and the lamination board are separately provided and bonded into one body by the laminating glue, so the overall difficulty of manufacturing the blade assembly may be reduced. Furthermore, by providing the mounting cavity, the LED light emitting units may be disposed in the blade assembly without protruding from the surface of the blade assembly, resulting in low wind resistance and noise during rotation of the blade assembly, and making the blade assembly not prone to bump and damage. The LED light emitting units are sealed in the mounting cavity such that no pin of the LED light emitting unit is exposed leading to superior dustproof and waterproof performance. The LED light emitting unit not using surface mounted device (SMD) can achieve a smaller volume and denser arrangement, thereby improving the overall display resolution.

In a possible embodiment of the present disclosure, a plurality of columns of light emitting assemblies are arranged at intervals in the mounting cavity along the length of the circuit substrate, each column of the plurality of columns of light emitting assemblies includes at least one of the plurality of LED light emitting units, the blade assembly has a center of rotation. Let the number of LED light emitting units contained in one column of the plurality of columns of light emitting assemblies adjacent to the center of rotation be X, and the number of LED light emitting units contained in one column of the plurality of columns of light emitting assemblies away from the center of rotation be Y, then X is less than Y.

In a possible embodiment of the present disclosure, when the number of LED light emitting units contained in one column of the plurality of columns of light emitting assemblies being greater than 1, all the plurality of LED light emitting units in the light emitting assembly are distributed along a set arc, and a center of the set arc is located at the center of rotation.

In a possible embodiment of the present disclosure, along the length of the circuit substrate, every n columns of the plurality of columns of light emitting assemblies is assigned a group, and there is arranged a total of m groups on the circuit substrate. The light emitting assemblies in a same group have a same number of LED light emitting units, the light emitting components of adjacent groups have different numbers of LED light emitting units, and the number of LED light emitting units contained in the plurality of columns of light emitting assemblies increases in a direction away from the center of rotation.

In a possible embodiment of the present disclosure, a difference in the number of LED light emitting units contained in the light emitting assemblies of adjacent groups is all Z.

In a possible embodiment of the present disclosure, the plurality of LED light emitting units is encapsulated in the mounting cavity by encapsulating glue; or the plurality of LED light emitting units is plastic encapsulated in the mounting cavity; or glue is dispensed on the plurality of LED light emitting units to form a sealing layer.

In a possible embodiment of the present disclosure, the lamination board has a third side attached to the circuit substrate and a fourth side opposite to the third side, the fourth side is provided with a light absorbing layer, and the mounting cavity is provided with a reflective layer.

In a possible embodiment of the present disclosure, the plurality of LED light emitting units are each a red-greenblue (RGB) light emitting unit, and the RGB light emitting unit includes a first chip, a second chip, and a third chip that are arranged at intervals along a width of the circuit substrate.

In a possible embodiment of the present disclosure, the first chip, the second chip, and the third chip of adjacent RGB light emitting units are arranged in a same order, and the first chips of two adjacent RGB light emitting units are arranged adjacent to each other.

In a possible embodiment of the present disclosure, the plurality of LED light emitting units are each a red-green-blue (RGB) light emitting unit, and the RGB light emitting unit includes a first chip, a second chip, and a third chip that are arranged at intervals along the length of the circuit substrate.

In a possible embodiment of the present disclosure, a length of each of the first chip, the second chip, and the third chip is consistent with the width of the circuit substrate.

In a possible embodiment of the present disclosure, the circuit substrate includes a second side opposite to the first side, and the second side is hermetically provided with a control member, the control member being electrically connected to the LED light emitting unit.

In a possible embodiment of the present disclosure, the control member is encapsulated on the second side by an encapsulating gluer.

In a possible embodiment of the present disclosure, the second side is annularly provided with a circumferential wall, and the control member is encapsulated in the circumferential wall by the encapsulating glue.

In a possible embodiment of the present disclosure, the second side is annularly provided with a circumferential wall, one end of the circumferential wall facing away from the second side is provided with a sealing plate, and the sealing plate seals the control member in the circumferential wall.

In a possible embodiment of the present disclosure, the sealing plate and the circumferential wall are bonded to each other by an adhesive layer.

In a possible embodiment of the present disclosure, the circumferential wall is filled with the encapsulating glue, and the side of the sealing plate facing towards the circumferential wall is provided with a heat dissipation layer.

In a possible embodiment of the present disclosure, the blade assembly further includes a sealing plate spaced at a side of the second side facing away from the first side, where a receiving cavity for receiving the control member is formed between the sealing plate and the second side, the sealing plate is adhered to the second side by an annular adhesive layer, and the adhesive layer seals the receiving cavity.

In a second aspect, there is provided a fan display, which includes a blade assembly and a drive assembly configured for driving the blade assembly into rotation.

BRIEF DESCRIPTION OF DRAWINGS

In order to explain embodiments of the present disclosure or the technical solution in the related art more clearly, the drawings that need to be used in the embodiments or in the description of the related art are simply introduced. Apparently, the drawings described below are some embodiments of the present disclosure or the simplified schematic diagram of the related art, and for those skilled in the art, other drawings may be obtained according to the drawings without creative work.

REFERENCE SIGNS

Figure 1:
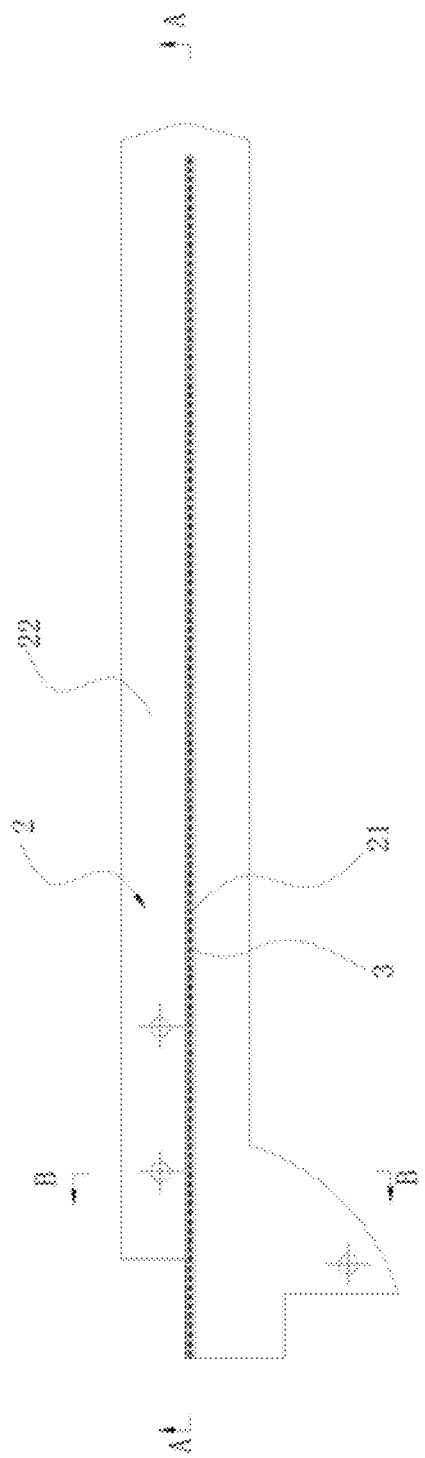
FIG. 1 is a front view of a blade assembly according to an embodiment of the present disclosure.
Figure 2:
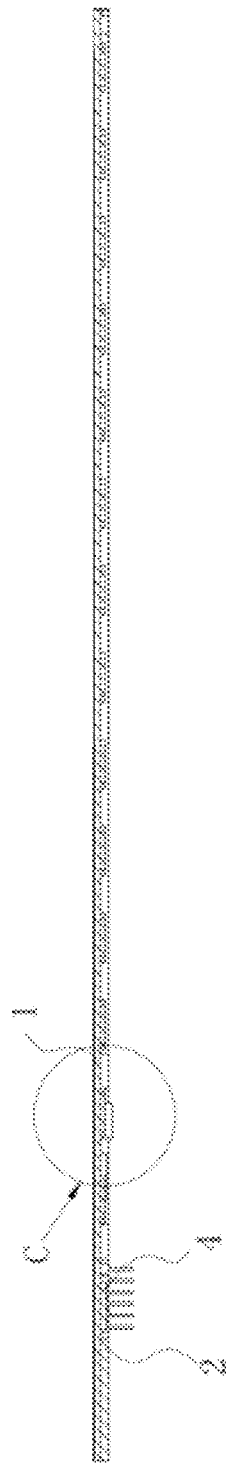
FIG. 2 is a cross-sectional view along A-A of FIG. 1.
Figure 3:
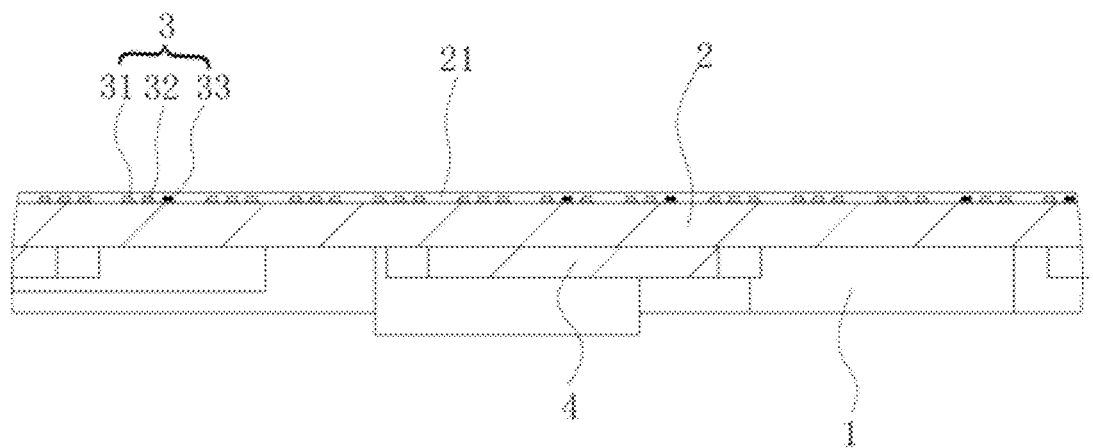
FIG. 3 is a partial enlarged view of portion C of FIG. 2.
Figure 4:
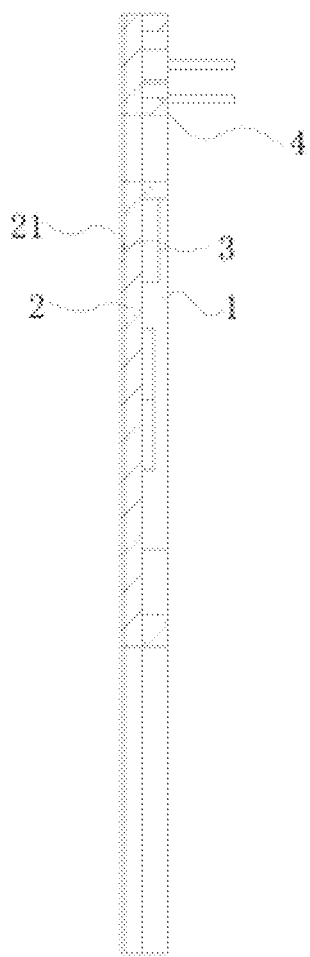
FIG. 4 is a cross-sectional view along B-B of FIG. 1.

1. Circuit substrate
11. Second side
12. Circumferential wall
2. Lamination board
21. Mounting cavity
22. Fourth side
23. Partitioning plate
24. Sub-cavity
3. LED light emitting unit
31. First chip
32. Second chip
33. Third chip
4. Control member
5. Sealing plate
6. Adhesive layer
7. Encapsulating glue
8. Light emitting assembly

DETAILED DESCRIPTION

Technical solutions reflected in the embodiments of the present disclosure will be described in a definite and comprehensive manner in connection with the drawings intended the embodiments of the present disclosure. Apparently, the described embodiments are part, not all, of the embodiments of the present disclosure. Based on the embodiments of the present disclosure, all other embodiments obtained by those skilled in the art without creative work shall all fall in the scope of the present disclosure.

As used herein, unless otherwise expressly specified and defined, terms "connected to each other", "connected to", "fixed to" are to be understood in a broad sense, for example, as fixedly connected, detachably connected or integrally connected; mechanically connected or electrically connected; directly connected or indirectly connected via an intermediate medium; or internally connected between two elements or interaction relationships between the two elements. For those skilled in the art, the above-mentioned term in the present disclosure may be understood depending on specific contexts.

In the embodiments of the present disclosure, unless otherwise expressly specified and defined, a first feature being "above" or "below" a second feature may include direct contact between the first feature and the second feature, or may include contact between the first feature and the second feature not directly but through additional features therebetween. Moreover, the first feature being "above" or "on" the second feature includes the first feature being directly above and obliquely above or on the second feature, or simply means that a horizontal height of the first feature is higher than a horizontal height of the second feature. The first feature being "below" the second feature includes the first feature being directly below and obliquely below the second feature, or simply means that the horizontal height of the first feature is higher than the horizontal height of the second feature.

The present disclosure provides a fan display, and the fan display includes a drive assembly and a blade assembly, where the drive assembly may drive the blade assembly to rotate around a fixed axis, and an output shaft end of the drive assembly may be connected to at least one blade assembly.

A number of blade assemblies may be set as needed. For example, when the number of blade assemblies is one, the output shaft end of the drive assembly may be connected to a middle portion of the blade assembly or an end portion of the blade assembly to drive the blade assembly to rotate around an axis of an output shaft. When the number of blade assemblies is two, two blade assemblies are arranged on a same plane in a straight line, and output shaft ends of the drive assemblies are respectively connected to ends of the two blade assemblies. When the number of blade assemblies is four, four blade assemblies are located on a same plane, an angle between two adjacent blade assemblies is 90°, and one end of each of the four blade assemblies is annularly evenly distributed along a circumferential direction of the output shaft of the drive assembly and is connected to the output shaft of the drive assembly.

The drive assembly is a motor, and an output shaft end of the motor is connected to the blade assembly.

Referring to FIG. 1 to FIG. 4, a blade assembly of the present disclosure includes a circuit substrate 1, a lamination board 2, and a plurality of light emitting diode (LED) light emitting units 3. Both the circuit substrate 1 and the lamination board 2 are in an elongated shape, and the circuit board 1 and the lamination board 2 are bonded by laminating glue. A mounting hole is defined in the lamination board 2, and the mounting hole passes through a thickness direction of the lamination board 2. The circuit substrate 1 has a first side attached to the lamination board 2, and the first side and the mounting hole jointly define a mounting cavity 21. The plurality of LED light emitting units 3 are hermetically disposed in the mounting cavity 21, and the plurality of LED light emitting units 3 is disposed at intervals along a length of the circuit substrate 1. The circuit substrate 1 and the lamination board 2 are separately disposed and bonded into one body by the laminating glue, so that an integral manufacturing difficulty of the blade assembly may be reduced. The LED light emitting unit 3 may be disposed in the blade assembly by setting the mounting cavity 21 without protruding from a surface of the blade assembly, so that the wind resistance and noise of the blade assembly during rotation are low and the blade assembly is not prone to bump and damage. The LED light emitting unit 3 is sealed in the mounting cavity 21 such that no pin of the LED light emitting unit 3 is exposed and an effect of dustproof and waterproof is good. A mode that the LED light emitting unit 3 does not use surface mounted devices (SMD) can achieve a smaller volume and denser arrangement, thereby improving the overall display resolution.

In an embodiment, the LED light emitting unit 3 is encapsulated in the mounting cavity 21 by encapsulating glue. The LED light emitting unit 3 is encapsulated with the encapsulating glue such that the LED light emitting unit 3 can be sealed with waterproof and dustproof treatment. Specifically, the encapsulating glue is transparent, and a light transmittance can reach 85%.

In addition, the encapsulating glue may further fill the whole mounting cavity 21, that is, an upper surface of the encapsulating glue is flush with a cavity opening of the mounting cavity 21. In this way, a flatness of a surface of the blade assembly may be further increased, and a wind resistance of the blade assembly during rotation may be reduced, thereby reducing noise.

In other embodiments, the LED light emitting unit 3 is not limited to being encapsulated with encapsulating glue. The LED light emitting unit 3 may further be directly plastic-encapsulated in the mounting cavity 21, and a plastic material is made of light-transmissive plastic. Alternatively, a sealing layer is formed on an outer surface of the LED light-emitting unit 3 in a dispensing manner, and the LED light-emitting unit 3 is subjected to waterproof and dustproof sealing treatment by the sealing layer.

Figure 16:
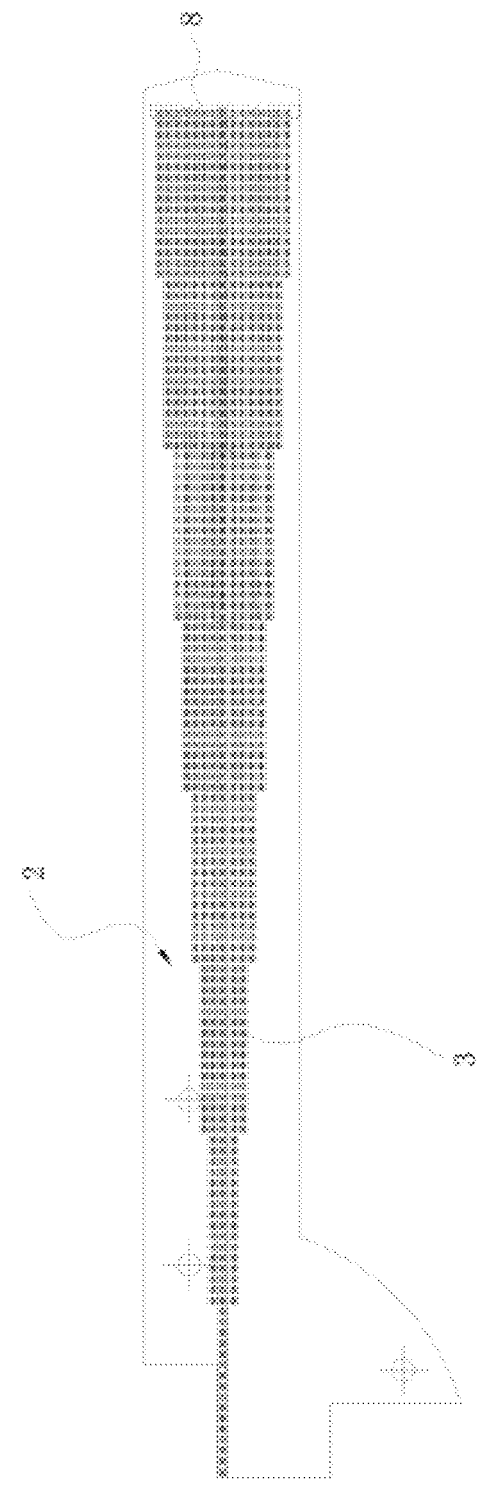
FIG. 16 is a top view of a blade assembly according to an embodiment of the present disclosure.

In an embodiment, referring to FIG. 16, a plurality of columns of light emitting assemblies 8 are disposed at intervals in the mounting cavity 21 along the length of the circuit substrate 1, each column of the plurality of columns of light emitting assemblies 8 includes at least one LED light emitting unit 3, the blade assembly has a center of rotation. Let the number of LED light emitting units 3 contained in one column of the plurality of columns of light emitting assemblies 8 adjacent to the center of rotation is X, and the number of LED light emitting units 3 contained in one column of the plurality of columns of light emitting assemblies 8 away from the center of rotation be Y, then X is less than Y. In this design, the number of LED light emitting units 3 is increased in a periphery, and brightness of the periphery of the screen can be compensated, such that the LED light-emitting units 3 of the whole fan display are in a use state with lower current, therefore effectively improving a service life of the LED light emitting unit 3.

The existing LED fan display has a structure in which one row of lamp beads are disposed on a surface of a blade of the fan display, and some problems exist when the one row of lamp beads rotate to form a screen for use. When the blade of the fan display rotate, a circular screen is formed, and a rotation radius is equally divided according to a spacing of each lamp bead to obtain a series of concentric rings, and areas of the concentric rings increase from small to large in sequence. When brightness of each lamp bead of the fan display is consistent, screen brightness is brightness of the lamp beads divided by a screen area, and brightness of the fan display will weaken from middle to the outside in sequence, that is, the screen brightness is non-uniform. In order to solve this problem, a solution of the existing product is to reduce brightness of a central lamp bead of the screen and increase brightness of a peripheral lamp bead, but this method is implemented by adjusting a use current of the lamp bead, the use current of the peripheral lamp bead will be quite large, a service life of the lamp bead will be greatly lost, and light decay of lamp beads of the whole screen will be inconsistent.

In this embodiment, when the number of LED light emitting units 3 contained in the light emitting assembly 8 is greater than 1, all the LED light emitting units 3 of the light emitting assembly 8 are distributed along a set arc, and a center of the set arc is located at the center of rotation.

In this embodiment, along the length of the circuit substrate 1, every n columns of the plurality of columns of light emitting assemblies 8 is a group, and a total of m groups are disposed on the circuit substrate 1; light emitting assemblies 8 in a same group have a same number of LED light emitting units 3, light emitting assemblies 8 of adjacent groups have different numbers of LED light emitting units 3, and a number of LED light emitting units 3 contained in the plurality of columns of light emitting assemblies 8 increases in a direction away from the center of rotation. Therefore, the above-mentioned grouping mode can improve uniformity of the screen brightness, and simultaneously reduce space occupied by the LED light emitting units 3 and the number of LED light emitting units 3 used as much as possible, thereby reducing a manufacturing cost.

Optionally, a difference in the number of LED light emitting units 3 contained in the light emitting assemblies of adjacent groups is Z. The number of the LED light emitting units 3 is progressively increased according to a set rule, and an optimal compensation mode can be implemented according to the light compensation demand on the blade assembly, therefore reducing the manufacturing cost.

In a specific embodiment of the present disclosure, eight groups of light emitting assemblies 8 are disposed on the blade assembly, each group of the light emitting assemblies 8 has sixteen columns of light emitting assemblies 8. Each column of the light emitting assemblies 8 in a first group includes one LED light emitting unit 3. Each column of the light emitting assemblies 8 in a second group includes three LED light emitting units 3. Each column of the light emitting assemblies 8 in a third group includes five LED light emitting unit 3. By analogy, each column of the light emitting assemblies 8 in a last group, that is, an eighth group, includes fifteen LED light emitting units 3. A difference in numbers of LED light emitting units 3 contained in each column of the light emitting assemblies 8 in adjacent groups is two.

A compute mode of brightness on the blade assembly of the fan display is described below.

When the blade assembly of the fan display rotates, the LED light emitting unit 3 moves in a concentric circle, and the whole screen consists of a concentric circle rings. Brightness of a single LED light emitting unit 3 on the blade assembly is L, a spacing of the LED light emitting units 3 is d, an inner diameter of a minimum concentric ring r1=0, an outer diameter of the minimum concentric ring r2=d, the inner diameter of a maximum concentric ring r3=(a−1)*d, and the outer diameter of the maximum concentric ring r4=ad.

For the existing fan display, brightness of a minimum concentric ring is $L1=L/\pi(r2^2-r1^2)=L/\pi d^2$, and brightness of a maximum concentric ring is $L2=L/\pi(r4^2-r3^2)=L/\pi d^2(2a-1)$. A brightness ratio of the minimum concentric ring and the maximum concentric ring is L1:L2=(2a−1):1. That is, when the brightness of the whole screen is to be consistent, brightness of an outermost LED light emitting unit 3 is 2a−1 times brightness of a center-most LED light emitting unit 3, and a use current of the outermost LED light emitting unit 3 is much larger than a use current of the center-most LED light emitting unit 3.

For the fan display of this scheme, the brightness of the minimum concentric ring is $L1=L/\pi(r2^2-r1^2)=L/\pi d^2$, and the brightness of the maximum concentric ring is $L2=bL/\pi(r4^2-r3^2)=bL/\pi d^2(2a-1)$, where b is the number of LED light emitting units 3 on the maximum concentric ring. Compared with brightness of an outermost single LED light emitting unit 3 of the existing fan display, brightness of an outermost single LED light emitting unit 3 in this scheme can be reduced to 1/b times at most. A brightness ratio of the minimum concentric ring and the maximum concentric ring is L1:L2=(2a−1):b. When the brightness of the whole screen is to be consistent, the brightness of the outermost single LED light emitting unit 3 is 1/(2a−1) times the brightness of the center-most single LED light emitting unit 3, and the use current of the outermost single LED light emitting unit 3 is much smaller than the use current of the outermost single LED light emitting unit 3 of the existing fan display.

In an embodiment, the lamination board 2 has a third side attached to the circuit substrate 1 and a fourth side 22 disposed opposite to the third side, the fourth side 22 is provided with a light absorbing layer, and the mounting cavity 21 is provided with a reflective layer. A contrast may be improved while increasing the brightness of the LED light emitting unit 3 by providing the light absorbing layer and the reflective layer.

In this embodiment, the reflective layer is a white coating and the light absorbing layer is a black coating. Black and white are two colors with a greatest color difference. The brightness and contrast of the LED light emitting unit 3 can be improved as much as possible by using the two colors. The reflective layer and the light absorbing layer are formed in a coating mode, such that a material cost of the circuit substrate 1 and the lamination board 2 can be reduced, and the circuit substrate 1 and the lamination board 2 may be made of a material such as common plastic, and then a white reflective layer and a black light absorbing layer are formed at corresponding positions of the circuit substrate 1 and the lamination board 2 in the coating mode.

Figure 5:
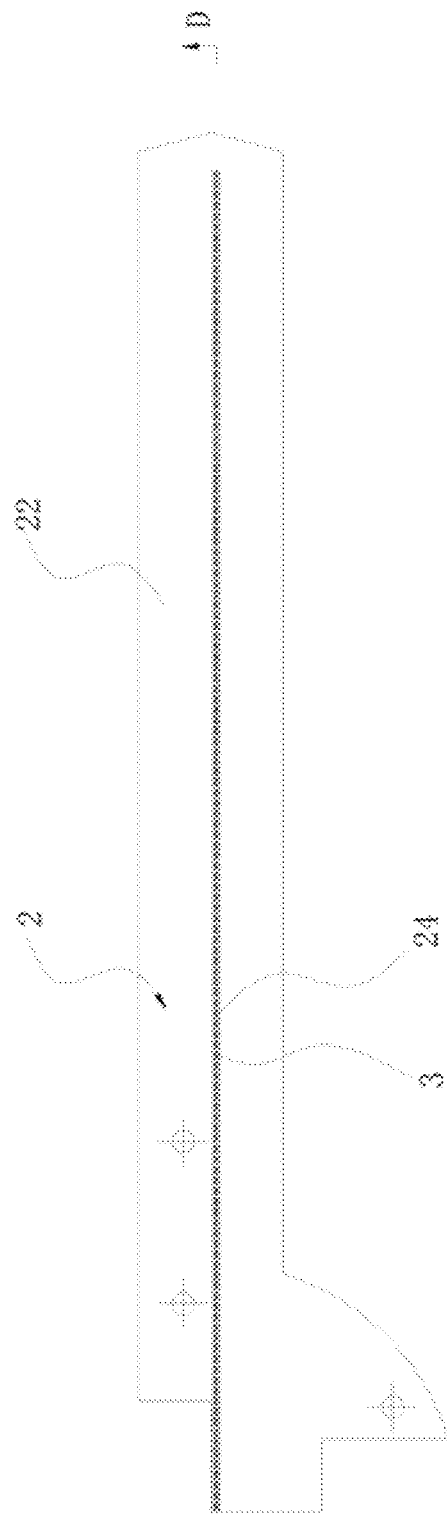
FIG. 5 is a front view of a blade assembly according to another embodiment of the present disclosure.
Figure 6:
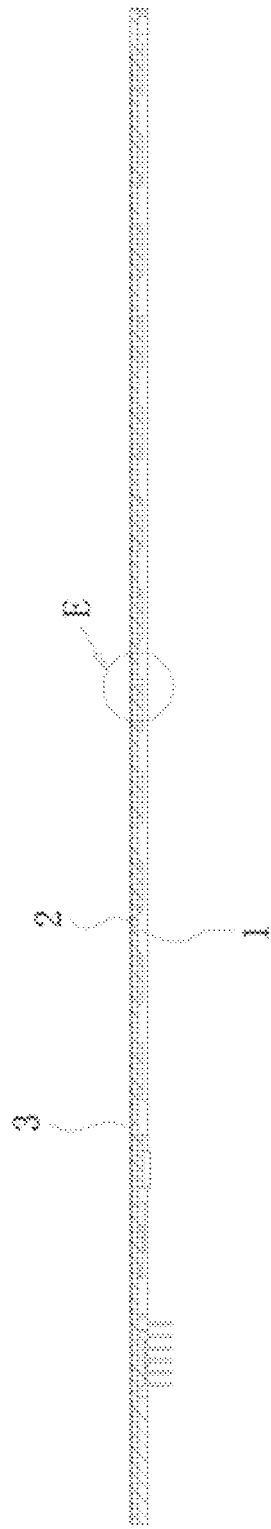
FIG. 6 is a cross-sectional view along D-D of FIG. 5.
Figure 7:
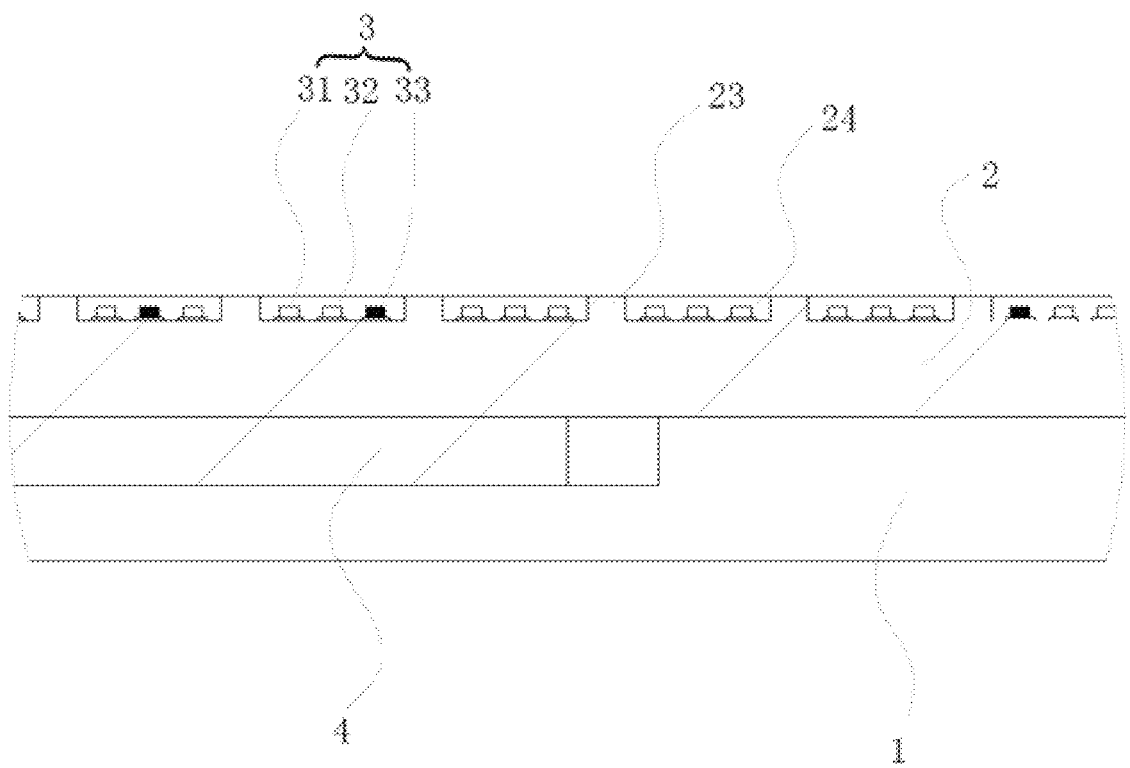
FIG. 7 is a partial enlarged view of portion E of FIG. 6.

In an embodiment, referring to FIG. 5 to FIG. 7, the mounting cavity 21 is further provided with a plurality of partitioning plates 23 dividing the mounting cavity 21 into a plurality of sub-cavities 24, and each of the plurality of sub-cavities 24 is provided with at least one LED light emitting unit 3. The partitioning plates 23 are provided such that optical crosstalk of LED light emitting units 3 in adjacent sub-cavities 24 may be effectively prevented, thereby improving a light mixing effect of adjacent LED light emitting units 3.

In this embodiment, each sub-cavity 24 is provided with one LED light emitting unit 3. All the LED light emitting units 3 on the blade assembly are separated by the partitioning plates 23, that is, each LED light emitting unit 3 is disposed in a separate sub-cavity 24, thereby achieving a better light mixing effect and anti-optical-crosstalk effect.

Optionally, an upper end surface of the partitioning plate 23 is flush with a light emitting surface of the lamination board 2 (that is, the fourth side 22 of the lamination board 2). In other embodiments, the upper end surface of the partitioning plate 23 may also be lower than the light emitting surface of the lamination board 2, that is, the partitioning plate 23 is completely mounted in the mounting cavity 21, and the upper end surface of the partitioning plate 23 and the light emitting surface are disposed at intervals.

In an embodiment, referring to FIG. 1 to FIG. 4, each LED light emitting unit 3 is a red-green-blue (RGB) light emitting unit, and the RGB light emitting unit includes a first chip 31, a second chip 32, and a third chip 33 disposed at intervals, and the first chip 31, the second chip 32, and the third chip 33 are disposed at intervals along the length of the circuit substrate 1. Furthermore, lengths of the first chip 31, the second chip 32 and the third chip 33 are all consistent with the width of the circuit substrate 1. This design can reduce the difficulty of circuit arrangement of the LED light emitting unit 3 and the manufacturing difficulty, reduce the repair work, and prevent the problem of pseudo soldering of a chip when the blade assembly bends because it is too long.

Figure 8:
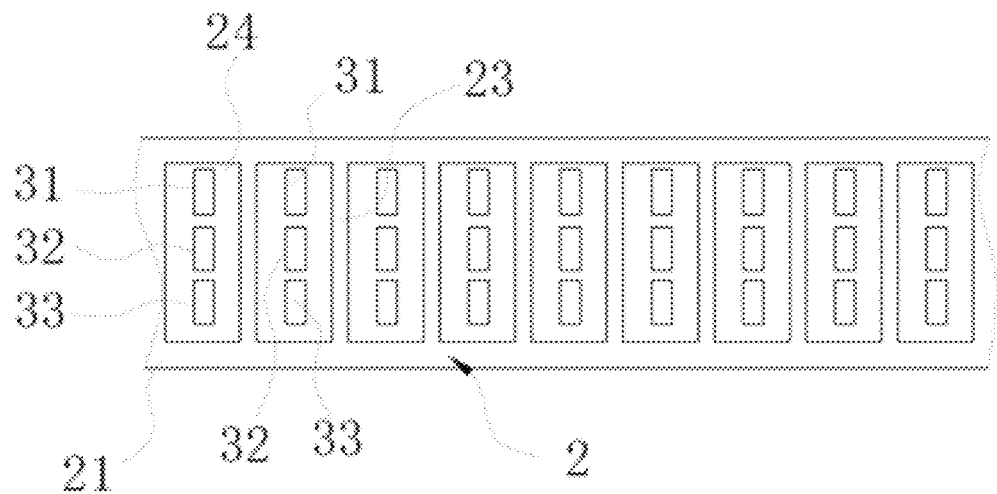
FIG. 8 is schematic diagram illustrating a chip arrangement of an LED light emitting unit according to an embodiment of the present disclosure.

In other embodiments, referring to FIG. 8, the first chip 31, the second chip 32, and the third chip 33 are disposed at intervals along the width of the circuit substrate 1. In this design, chips on the blade assembly are disposed denser, the spacing between the LED light emitting units 3 is smaller, and a resolution is higher. Furthermore, the lengths of the chips are consistent with the width of the circuit substrate 1, thereby preventing the problem of pseudo soldering of the chip when the blade assembly bends since it is too long.

In this embodiment, adjacent RGB light emitting units have a same arrangement order of the first chip 31, the second chip 32 and the third chip 33, and first chips 31 of two adjacent RGB light emitting units are disposed adjacent to each other. In this design, a spacing between chips emitting a same color light is smaller, and the resolution can be improved to the largest degree.

Figure 9:
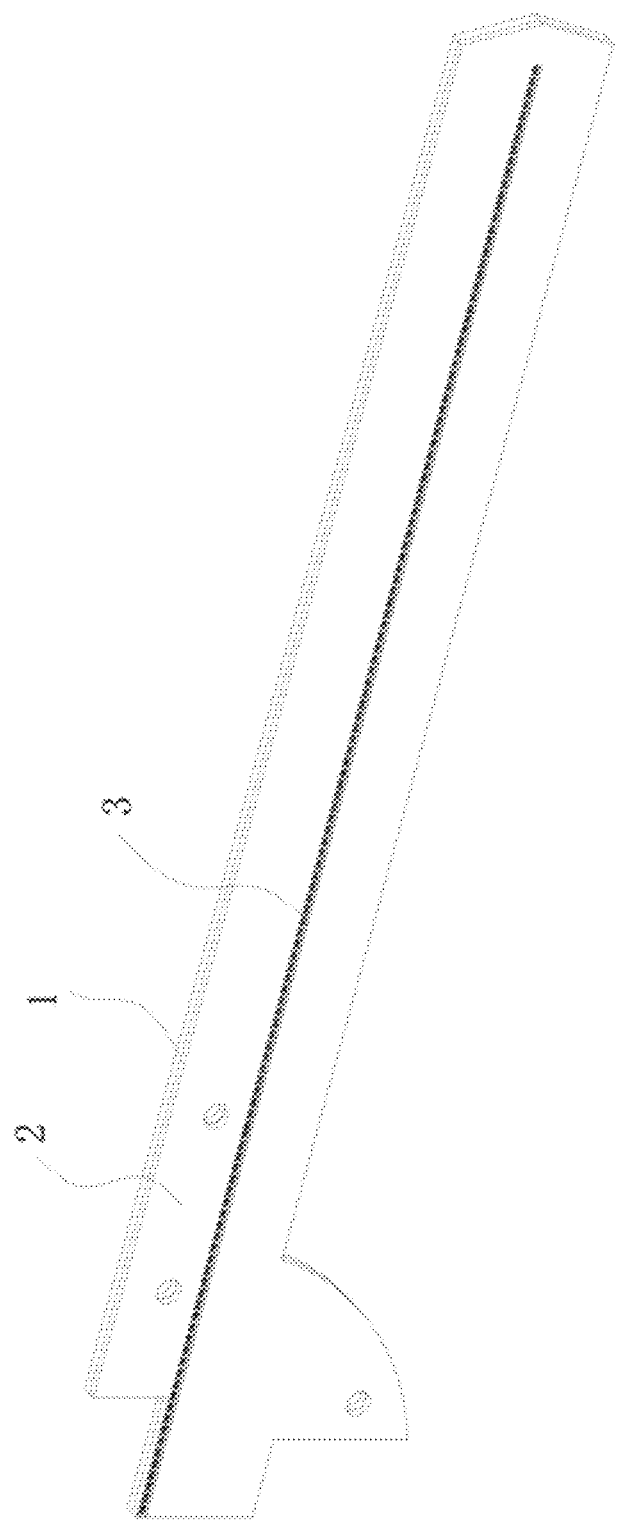
FIG. 9 is a perspective view of a blade assembly according to another embodiment of the present disclosure.
Figure 10:
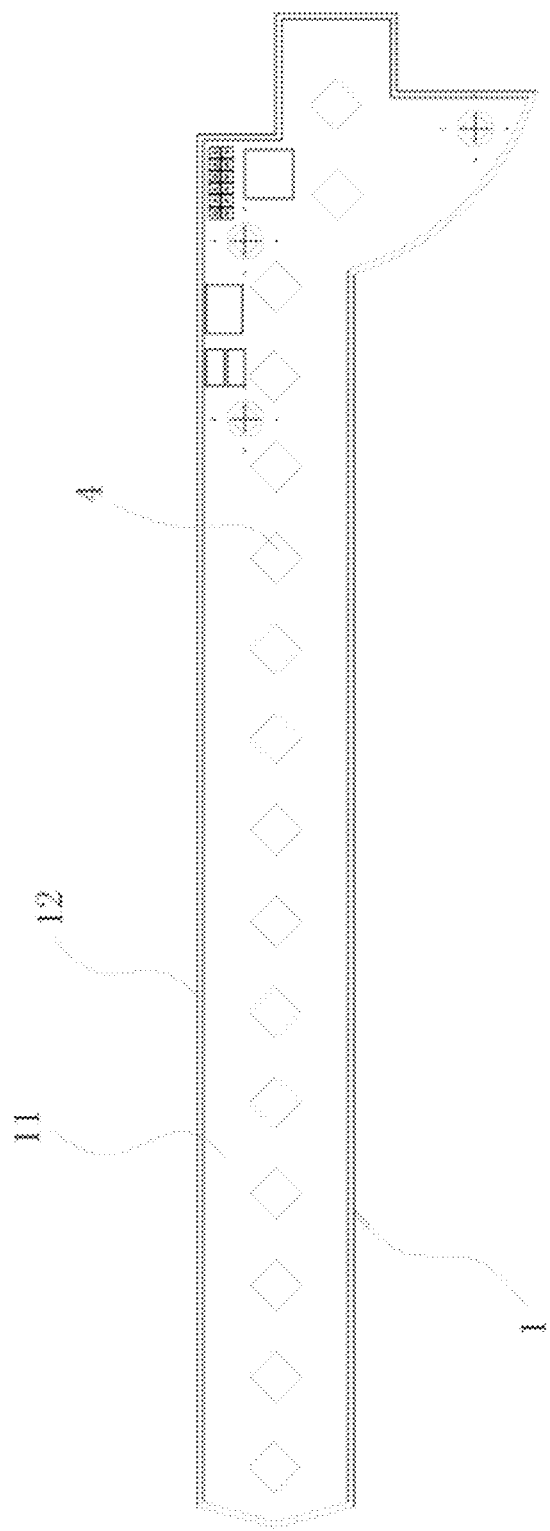
FIG. 10 is a rear view of a blade assembly according to another embodiment of the present disclosure.
Figure 11:
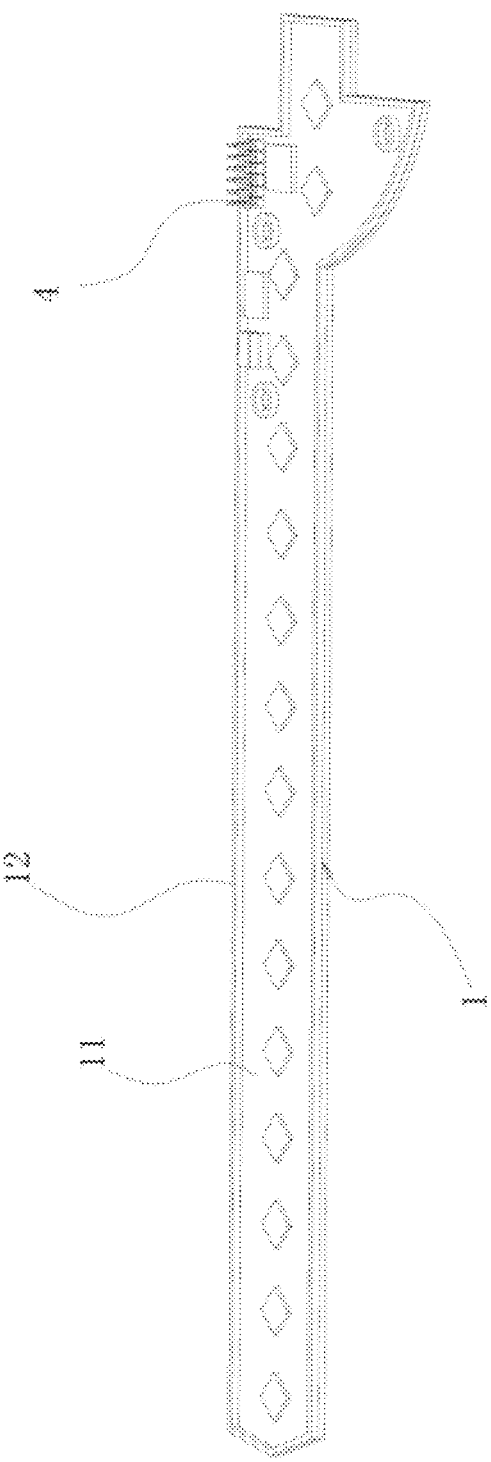
FIG. 11 is a perspective view of a blade assembly from another perspective according to another embodiment of the present disclosure.

In an embodiment, referring to FIG. 9 to FIG. 11, the circuit substrate 1 has a second side 11 disposed opposite to the first side, and the second side 11 is hermetically provided with a control member 4 electrically connected to the LED light emitting unit 3. The control member 4 on the second side 11 of the circuit substrate 1 is sealed, therefore preventing external water and dust from entering the control member 4 to affect a normal use of the control member 4.

Optionally, the control member 4 is encapsulated on the second side 11 by the encapsulating glue. Specifically, the control member 4 is first fixed to the second side 11 of the circuit substrate 1 during manufacture and electrically connected to the LED light emitting unit 3, and then encapsulated on the second side 11 by the encapsulating glue.

The second side 11 is annularly provided with a circumferential wall 12, and the control member 4 is encapsulated in the circumferential wall 12 by the encapsulating glue. A sealing effect may be improved by providing the circumferential wall 12, and the overall appearance of the blade assembly may beautiful after the control member 4 is encapsulated with the encapsulating glue.

Figure 12:
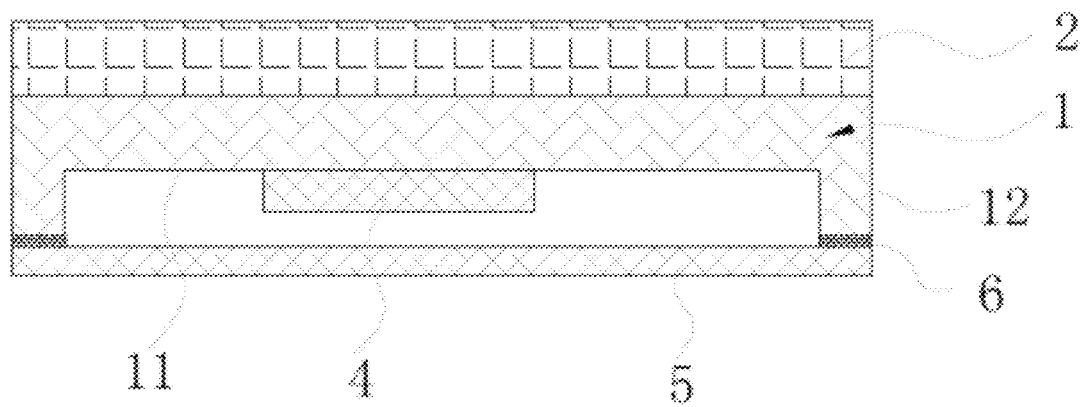
FIG. 12 is a cross-sectional view of a blade assembly according to an embodiment of the present disclosure.

In an embodiment, referring to FIG. 12, the control member 4 is not limited to being sealed in the manner of the above-mentioned embodiment (that is, being sealed in the circumferential wall 12 by the encapsulating glue), and the control member 4 may further be sealed by a combined structure of the circumferential wall 12 and the sealing plate 5. Specifically, the sealing plate 5 is disposed at an end of the circumferential wall 12 facing away from the second side 11, and the sealing plate 5 seals the control member 4 in the circumferential wall 12.

In this embodiment, the sealing plate 5 and the circumferential wall 12 are bonded by an adhesive layer 6. The sealing plate 5 and the circumferential wall 12 are fixed in an adhesive manner, such that use of fixing pieces is reduced, a dismounting difficulty is reduced, and a weight of the whole blade assembly may be reduced at the same time. In addition, the adhesive layer 6 may also seal a gap between the sealing plate 5 and the circumferential wall 12, such that a sealing space is formed in the circumferential wall 12, ensuring that the control member 4 in the circumferential wall 12 is in a sealed state.

Figure 13:
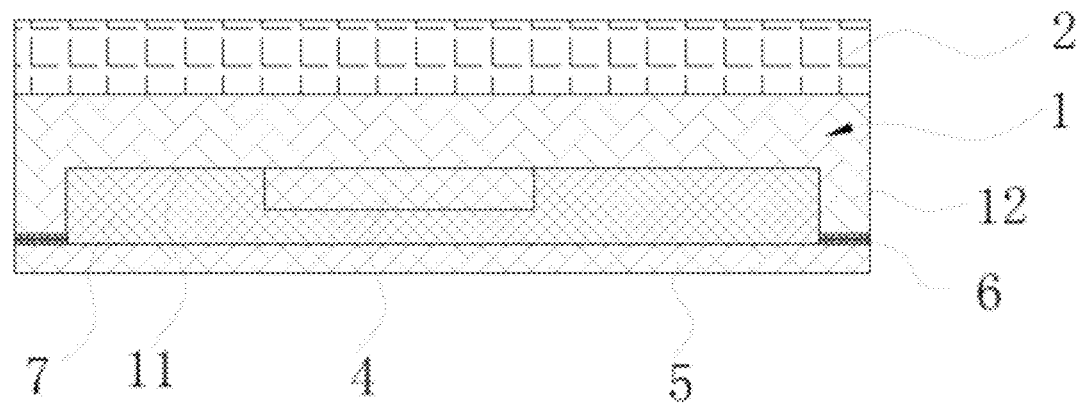
FIG. 13 is a cross-sectional view of a blade assembly according to another embodiment of the present disclosure.

Preferably, referring to FIG. 13, the control member 4 may further be firstly encapsulated in the circumferential wall 12 by the encapsulating glue 7, and then the sealing plate 5 is fixed on the circumferential wall 12 by the adhesive layer 6, thereby achieving double sealing and improving the sealing effect.

When the sealing plate 5 is being disposed, a heat dissipation layer may be disposed on a side of the sealing plate 5 facing towards an inner side of the circumferential wall 12, and a heat dissipation effect of the control member 4 disposed in the circumferential wall 12 can be accelerated by the heat dissipation layer. Specifically, the encapsulating glue 7 is directly in contact with the heat dissipation layer on the sealing plate 5, thereby improving the heat conduction efficiency and the heat dissipation effect.

In this embodiment, the heat dissipation layer is a copper heat dissipation layer.

Figure 14:
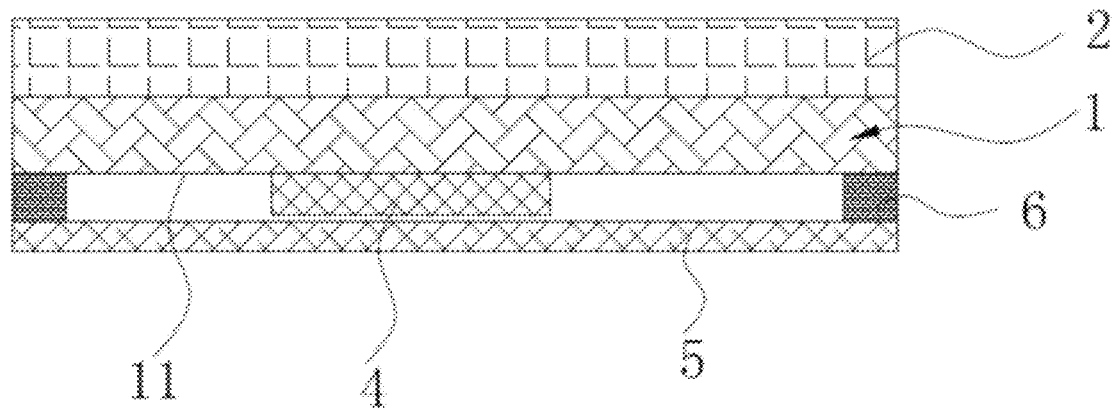
FIG. 14 is a cross-sectional view of a blade assembly according to another embodiment of the present disclosure.

In other embodiments, the circumferential wall 12 may further be eliminated, and the control member 4 is sealed by directly providing the sealing plate 5 and the adhesive layer 6. Referring to FIG. 14, the sealing plate 5 is disposed at intervals on a side of the second side 11 of the circuit substrate 1 facing away from the first side, and a receiving cavity for receiving the control member 4 is formed between the sealing plate 5 and the second side 11. The sealing plate 5 is bonded to the second side 11 by an annular adhesive layer 6, and the adhesive layer 6 seals the receiving cavity.

Figure 15:
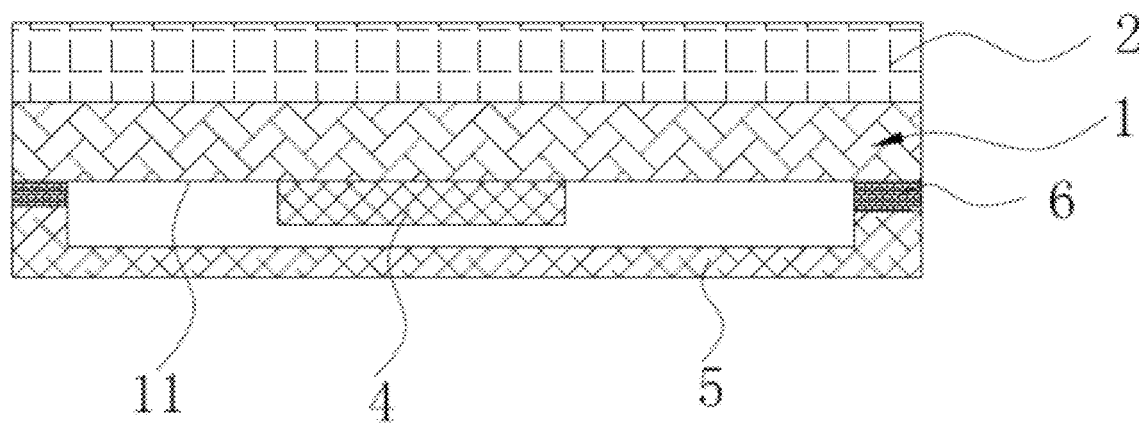
FIG. 15 is a cross-sectional view of a blade assembly according to another embodiment of the present disclosure.

In order to increase a cavity volume of the receiving cavity, the sealing plate 5 may be provided as a packaging housing structure with one end sealed and the other end opened. Referring to FIG. 15, an opening end of the sealing plate 5 is connected to the second side 11 by the adhesive layer 6, and a sealing end of the sealing plate 5 and the second side 11 are disposed at intervals, such that the receiving cavity receiving the control member 4 is formed, thus reducing a thickness of the adhesive layer 6.

In the description of the specification, the description referring to the terms of "an embodiment", "example" and the like means that the specific features, structures, materials, or traits described in connection with the embodiment or example are included in at least one embodiment or example of the present disclosure. In the specification, schematic expressions of the above-mentioned terms do not necessarily refer to the same embodiments or examples. Moreover, the specific features, structures, materials, or traits described may be incorporated in any one or more embodiments or examples in a suitable manner.

The technical principle of the present disclosure has been described above in connection with specific embodiments. The foregoing description is intended for the mere purpose of illustrating the principle of the present disclosure and is not to be construed in any means as limiting the scope of the present disclosure. Based on the illustration herein, those skilled in the art may be able to think of other specific embodiments of the present disclosure without making creative efforts, and these embodiments shall all fall in the scope of protection of the present disclosure.

What is claimed is:

1. A blade assembly, comprising:
   a circuit substrate;
   a lamination board; and
   a plurality of light emitting diode (LED) light emitting units;

wherein the circuit substrate and the lamination board each have an elongated shape, and are bonded to each other by a laminating glue; a mounting hole is defined in the lamination board and passes through a thickness of the lamination board; the circuit substrate comprises a first side attached to the lamination board, the first side and the mounting hole jointly defining a mounting cavity; and the plurality of LED light emitting units are hermetically arranged in the mounting cavity and are arranged at intervals along a length of the circuit substrate, wherein the plurality of LED light emitting units are each a red-green-blue (RGB) light emitting unit, and the RGB light emitting unit comprises a first chip, a second chip, and a third chip that are arranged at intervals, and wherein each of the first chip, the second chip and the third chip is rectangular and has a length direction is consistent with a width direction of the circuit substrate.

2. The blade assembly of claim 1, wherein a plurality of columns of light emitting assemblies are arranged at intervals in the mounting cavity along the length of the circuit substrate, each column of the plurality of columns of light emitting assemblies comprising at least one of the plurality of LED light emitting units, and the blade assembly has a center of rotation, and wherein let the number of LED light emitting units contained in one of the plurality of columns of light emitting assemblies adjacent to the center of rotation be X, and the number of LED light emitting units contained in one of the plurality of columns of light emitting assemblies away from the center of rotation be Y, X is less than Y.

3. The blade assembly of claim 2, wherein when the number of LED light emitting units contained in a column of the plurality of columns of light emitting assemblies is greater than 1, all the LED light emitting units in the light emitting assembly are distributed along a set arc, where a center of the set arc lies at the center of rotation.

4. The blade assembly of claim 2, wherein along the length of the circuit substrate, every n columns of the plurality of columns of light emitting assemblies is assigned as a group, and there is arranged a total of m groups on the circuit substrate; wherein the light emitting assemblies in a same group have a same number of LED light emitting units, the light emitting assemblies of adjacent groups have different numbers of LED light emitting units, and the number of LED light emitting units contained in the plurality of columns of light emitting assemblies increases in a direction away from the center of rotation.

5. The blade assembly of claim 4, wherein a difference in the number of LED light emitting units contained in the light emitting assemblies of adjacent groups is all Z.

6. The blade assembly of claim 1, wherein the plurality of LED light emitting units are encapsulated in the mounting cavity by an encapsulating glue; or the plurality of LED light emitting units are plastic encapsulated in the mounting cavity; or glue is dispensed on the plurality of LED light emitting units to form a sealing layer.

7. The blade assembly of claim 1, wherein the lamination board has a third side attached to the circuit substrate and a fourth side opposite to the third side, and wherein the fourth side is provided with a light absorbing layer, and the mounting cavity is provided with a reflective layer.

8. The blade assembly of claim 1, wherein the first chip, the second chip and the third chip are arranged at the intervals along a width of the circuit substrate.

9. The blade assembly of claim 8, wherein the first chip, the second chip, and the third chip of adjacent RGB light emitting units are arranged in a same order, and the first chips of two adjacent RGB light emitting units are arranged adjacent to each other.

10. The blade assembly of claim 1, wherein the first chip, the second chip and the third chip are arranged at the intervals along the length of the circuit substrate.

11. The blade assembly of claim 1, wherein the circuit substrate comprises a second side opposite to the first side, and the second side is hermetically provided with a control member, the control member being electrically connected to the LED light emitting unit.

12. The blade assembly of claim 11, wherein the control member is encapsulated on the second side by an encapsulating glue.

13. The blade assembly of claim 12, wherein the second side is annularly provided with a circumferential wall, and the control member is encapsulated in the circumferential wall by the encapsulating glue.

14. The blade assembly of claim 12, wherein the second side is annularly provided with a circumferential wall, wherein an end of the circumferential wall facing away from the second side is provided with a sealing plate, which seals the control member in the circumferential wall.

15. The blade assembly of claim 14, wherein the sealing plate and the circumferential wall are bonded to each other by an adhesive layer.

16. The blade assembly of claim 14, wherein the circumferential wall is filled with the encapsulating glue, and the side of the sealing plate facing towards the circumferential wall is provided with a heat dissipation layer.

17. The blade assembly of claim 11, further comprising a sealing plate spaced at a side of the second side facing away from the first side, wherein a receiving cavity for receiving the control member is formed between the sealing plate and the second side, the sealing plate is adhered to the second side by an annular adhesive layer, and the adhesive layer seals the receiving cavity.

18. A fan display, comprising a blade assembly and a drive assembly configured for driving the blade assembly into rotation, the blade assembly being the blade assembly of claim 1.

* * * * *